(12) United States Patent
Sun

(10) Patent No.: US 8,416,097 B2
(45) Date of Patent: Apr. 9, 2013

(54) CHARGE INDICATOR CIRCUIT AND ELECTRONIC DEVICE USING THE SAME

(75) Inventor: Jian Sun, Shenzhen (CN)

(73) Assignees: Shenzhen Futaihong Precision Industry Co., Ltd., Shenzhen (CN); Chi Mei Communication Systems, Inc., New Taipei (TW)

( * ) Notice: Subject to any disclaimer, the term of this patent is extended or adjusted under 35 U.S.C. 154(b) by 818 days.

(21) Appl. No.: 12/581,265

(22) Filed: Oct. 19, 2009

(65) Prior Publication Data

US 2010/0277336 A1 Nov. 4, 2010

(30) Foreign Application Priority Data

Apr. 30, 2009 (CN) .......................... 2009 1 0302043

(51) Int. Cl.
*G08B 5/22* (2006.01)

(52) U.S. Cl. .................. 340/815.45; 320/119; 320/125

(58) Field of Classification Search .................. 320/119, 320/125; 340/815.45
See application file for complete search history.

(56) References Cited

U.S. PATENT DOCUMENTS

| | | | | |
|---|---|---|---|---|
| 5,557,188 A | * | 9/1996 | Piercey .......................... | 320/134 |
| 5,955,868 A | * | 9/1999 | Kaite et al. .................... | 320/119 |
| 8,102,147 B2 | * | 1/2012 | Jung ............................. | 320/108 |
| 8,188,709 B2 | * | 5/2012 | Onishi et al. .................. | 320/108 |

* cited by examiner

*Primary Examiner* — Daryl Pope
(74) *Attorney, Agent, or Firm* — Altis Law Group, Inc.

(57) ABSTRACT

A charge indicator circuit for indicating an electronic device charged by an inputted charge electric potential includes an interface unit, a switch unit connected to the interface unit; a processor unit connected to the switch unit, and an indicator unit connected to the switch unit. The charge electric potential is inputted into the charge indicator circuit from the interface unit and powers the indicator unit to emit light when the processor unit is switched off, and the processor unit detects the charge status of the electronic device and controls the switch unit according to the detect results when the processor unit is switched on.

15 Claims, 3 Drawing Sheets

CHARGE INDICATOR CIRCUIT AND ELECTRONIC DEVICE USING THE SAME

BACKGROUND

1. Technical Field

The present disclosure relates to charge indicator circuits used in electronic devices, and particularly to a charge indicator circuit capable of indicating charge statuses of switched off electronic devices and an electronic device using the same.

2. Description of Related Art

Portable electronic devices, such as mobile phones, personal digital assistants (PDA) and laptop computers, are widely used. Most portable electronic devices use chargeable batteries as power supplies. When the electric energy of the batteries is exhausted, the portable electronic devices can be connected to other power supplies by chargers to charge the batteries.

Generally, these portable electronic devices have indicators electronically connected to their batteries for indicating charge statuses of their batteries. When the portable electronic devices are charged, the indicators can show the charge statuses of the batteries by visual signals, e.g., images, flashes or light in different colors. If the indicators show that the batteries are fully charged, the users can stop the charge operation in time to protect the batteries from overcharge.

However, if a portable electronic device is not charged in time, the battery of the portable electronic device may overdischarge. Thus, the electric potential of the battery will go below a certain voltage inadequate to power the portable electronic device, such that the portable electronic device is automatically switched off. When the overdischarged portable electronic device is connected to a charge power supply to be charged, the portable electronic device cannot be immediately actuated until the electric potential of the battery returns to the working electric potential. Before the portable electronic device is actuated, despite the battery having been charged, the indicator of the portable electronic device cannot indicate the charge status of the battery.

Therefore, there is room for improvement within the art.

BRIEF DESCRIPTION OF THE DRAWINGS

Many aspects of the present charge indicator circuit and electronic device using the same can be better understood with reference to the following drawings. The components in the various drawings are not necessarily drawn to scale, the emphasis instead being placed upon clearly illustrating the principles of the present charge indicator circuit and electronic device using the same. Moreover, in the drawings, like reference numerals designate corresponding parts throughout the figures.

DETAILED DESCRIPTION

Figure 1:
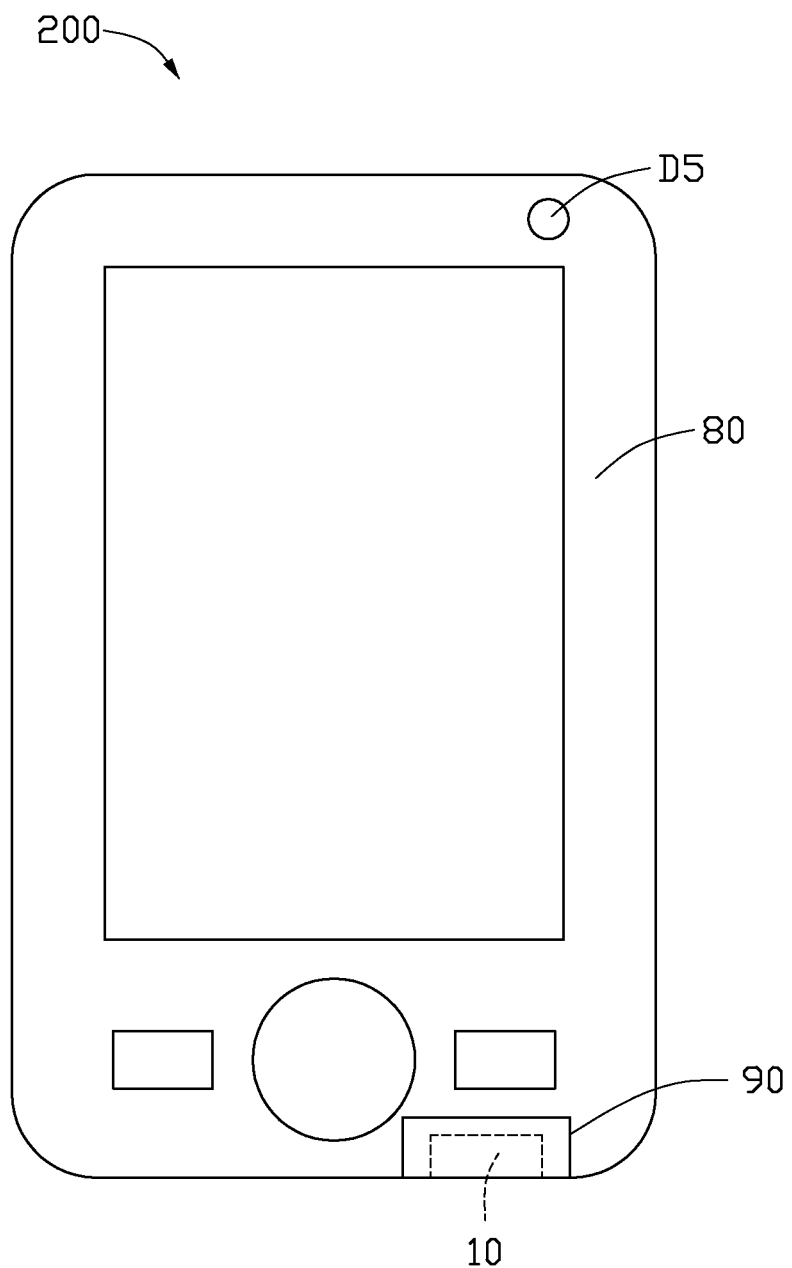
FIG. 1 is a schematic view of an electronic device, according to an exemplary embodiment.
Figure 2:
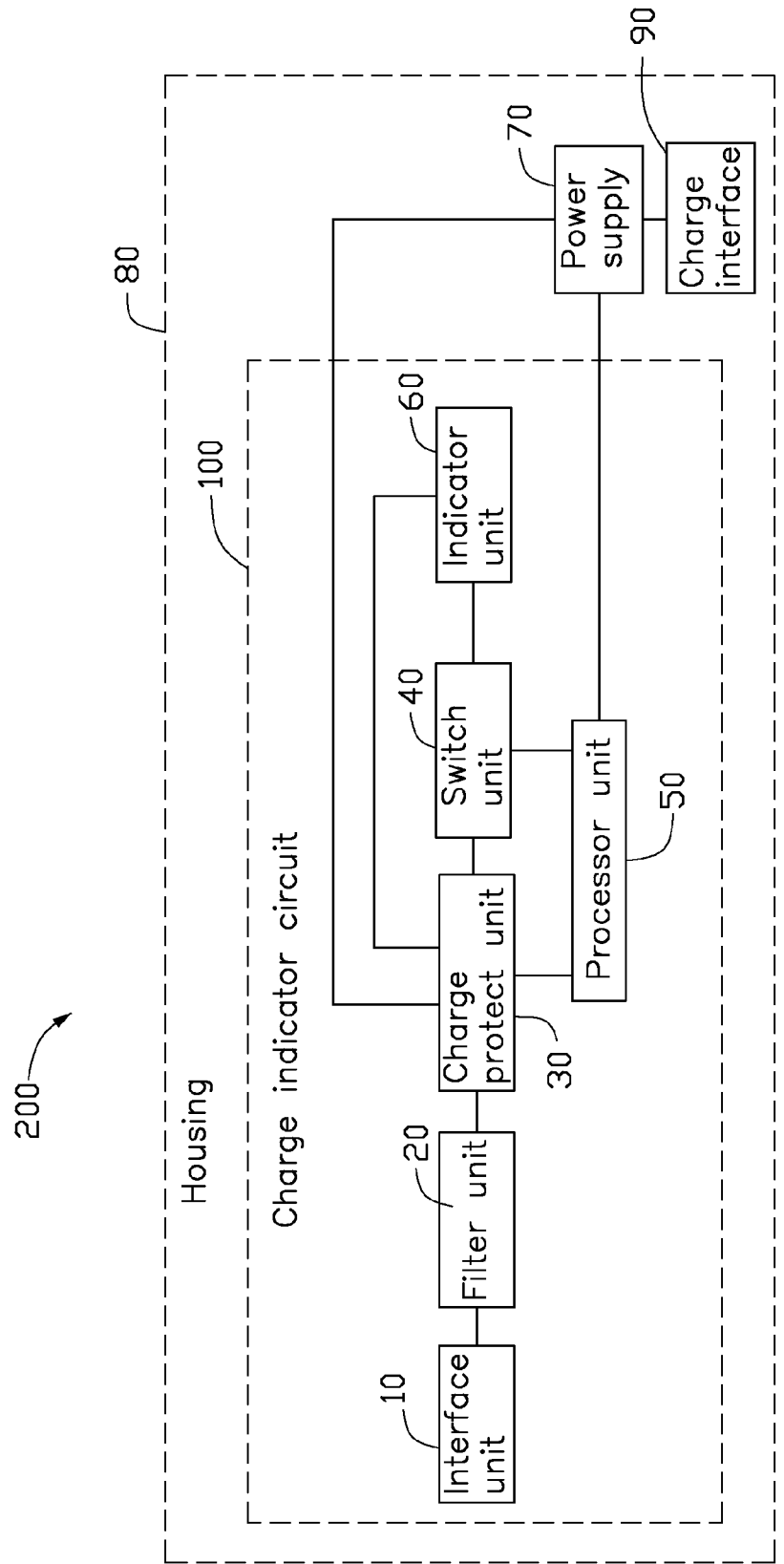
FIG. 2 is a block diagram of a charge indicator circuit, according to an exemplary embodiment.

FIG. 1 schematically shows a portable electronic device 200 according to an exemplary embodiment. The portable electronic device 200 can be a mobile phone, a personal digital assistant (PDA), a laptop computer, etc. Also referring to FIG. 2, the portable electronic device 200 includes a charge indicator circuit 100. The charge indicator circuit 100 includes an interface unit 10, a filter unit 20, a charge protect unit 30, a switch unit 40, a processor unit 50 and an indicator unit 60. The interface unit 10, the filter unit 20, the charge protect unit 30, the switch unit 40 and the indicator unit 60 are electronically connected in series. The charge protect unit 30 and the switch unit 40 are both electrically connected to the processor unit 50. The charge protect unit 30 is also electrically connected to the indicator unit 60.

The portable electronic device 200 further includes a power supply 70, a housing 80 and a charge interface 90. The power supply 70 is electrically connected to the charge protect unit 30, the processor unit 50 and the charge circuit 90. The interface unit 10, the filter unit 20, the charge protect unit 30, the switch unit 40, the processor unit 50 and the power supply 70 are all received in the housing 80. The charge interface 90 is a conventional charge interface mounted on the housing 80. The charge interface 90 can be connected to a charge power supply (not shown) by a charger (not shown), thereby inputting a charge electric potential into the power supply 70 to charge the portable electronic device 200.

The interface unit 10 is an input connector mounted on the housing 80, and can be integrated within the charge interface 90. When the power supply 70 is connected to a charge power supply by the charge interface 90 to be charged, the interface unit 10 can be also connected to the charge power supply, such that the charge electric potential inputted into the power supply 70 by the charge interface 90 is synchronously inputted into the charge indicator circuit 100 by the interface unit 10.

Figure 3:
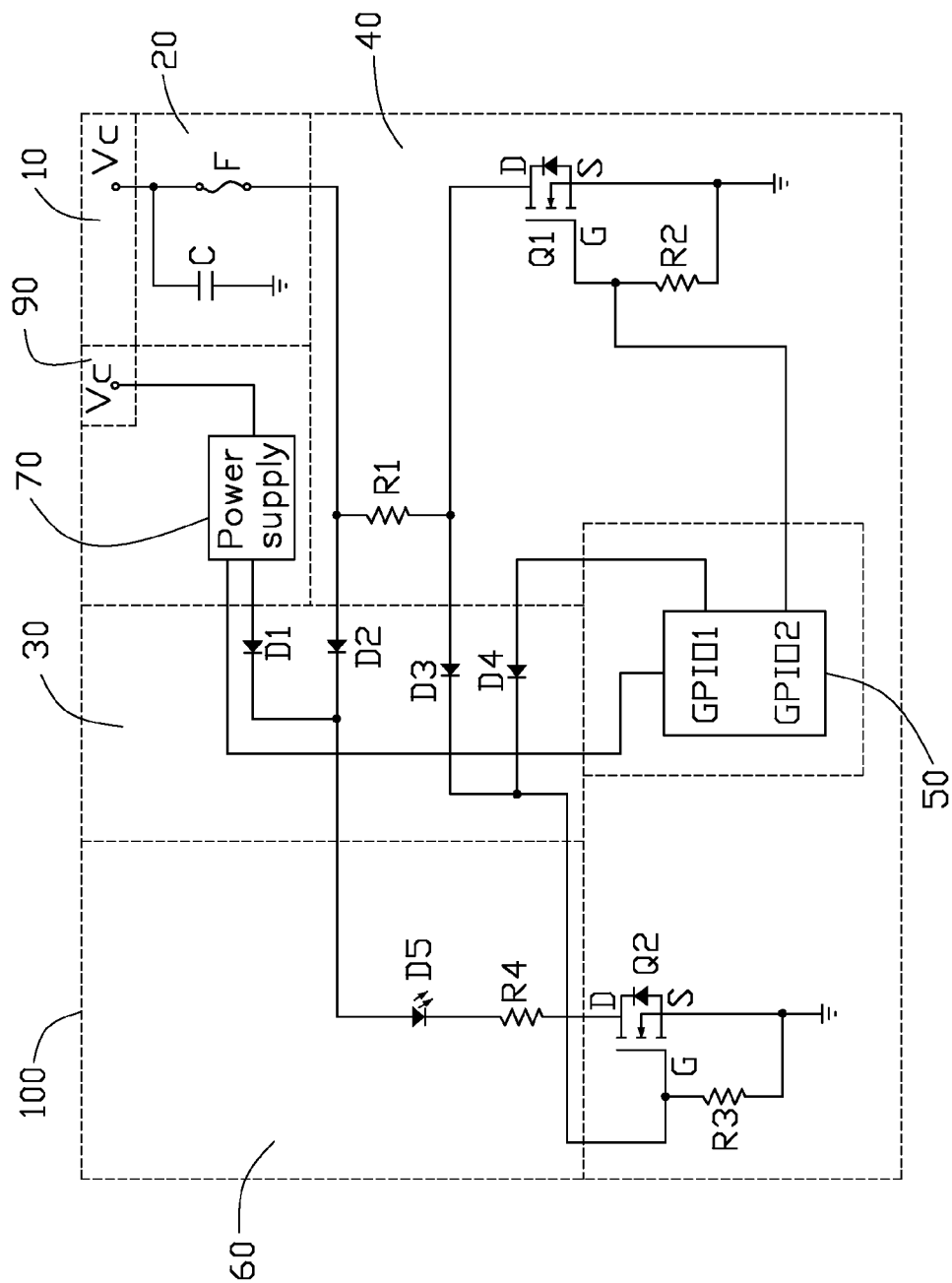
FIG. 3 is a circuit diagram of the charge indicator circuit shown in FIG. 2.

Also referring to FIG. 3, the filter unit 20 includes a filter capacitor C and a fuse F. The filter capacitor C has one pole connected to the interface unit 10 and another pole grounded. The fuse F has one end connected to the interface unit 10 and another end connected to the charge protect unit 30.

The charge protect unit 30 includes four diodes D1, D2, D3, D4, which are used to protect the portable electronic device 200, the charger, and the charge power supply from flow-backwards electric currents generated in the charge process. The fuse F is connected to the cathode of the diode D2. The switch unit 40 includes a first transistor Q1, a second transistor Q2, and three resistors R1, R2, R3. The transistors Q1, Q2 are both Complementary Metal Oxide Semiconductor (CMOS) transistors. The sources of the transistors Q1, Q2 are both grounded. The drain of the first transistor Q1 is connected to the anode of the diode D3, and the cathode of the diode D3 is connected to the gate of the second transistor Q2. The resistor R1 has one end connected between the fuse F and the anode of the diode D2, and another end connected between the drain of the first transistor Q1 and the anode of the diode D3. The resistor R2 has one end connected between the source of the first transistor Q1 and the ground, and another end connected to the gate of the first transistor Q1. The resistor R3 has one end connected between the source of the second transistor Q2 and the ground, and another end connected to the gate of the second transistor Q2.

The processor unit 50 can be a conventional Micro Controller unit (MCU) of the portable electronic device 200. The processor unit 50 includes at least two ports GPIO1, GPIO2. The port GPIO1 is connected to the anode of the diode D4, and the cathode of the diode D4 is connected to the gate of the second transistor Q2. The port GPIO2 is connected to the gate of the first transistor Q1.

The indicator unit 60 includes a light emitting diode (LED) D5 and a resistor R4. The LED D5 is mounted on an outside portion of the housing 80, as shown in FIG. 1. The cathodes of the diodes D1 and D3 are both connected to the anode of the LED D5. The resistor R4 has one end connected to the cathode of the LED D5 and another end connected to the drain of the second transistor Q2.

The power supply 70 can be a conventional changeable battery, which is connected to conventional circuits (not shown) of the portable electronic device 200. The processor unit 50 is also connected to the power supply 70 by the conventional circuits to be supplied with working electric power by the power supply 70. When the electric potential of the power supply 70 is higher than a predetermined actuating electric potential of the portable electronic device 200, the power supply 70 can actuate the portable electronic device 200 and supply working electric power to the portable electronic device 200 and the processor unit 50. Thus, the portable electronic device 200 and the processor unit 50 are synchronously switched on and switched off. The processor unit 50 can also detect the charge status of the power supply 70. The power supply 70 is also connected to the anode of the diode D1.

If the electric power of the power supply 70 is exhausted and the interface unit 10 is not connected to a charge power supply, the portable electronic device 200 cannot be actuated. The charge unit 100 does not work, and the LED D5 does not emit light. Thus, the users of the portable electronic device 200 can realize that the portable electronic device 200 needs to be charged.

As the above-mentioned method, when the portable electronic device 200 is charged, the charge interface 90 is connected to a charge power supply (not shown) by a charger (not shown), and a charge electric potential $V_C$ supplied by the charge power supply is inputted into the power supply 70 to charge the power supply 70. The interface unit 10 is also connected to the charge power supply, such that the charge electric potential $V_C$ inputted into the power supply 70 by the charge interface 90 is synchronously inputted to the charge indicator circuit 100 by the interface unit 10. Thus, the charge indicator circuit 100 can synchronously indicate charge statuses of the power supply 70.

When the interface unit 10 is first connected to a charge power supply, the electric potential of the power supply 70 may be lower than the working electric potential of the portable electronic device 200 (e.g., in a case that the power supply 70 is overdischarged), and the portable electronic device 200 cannot be actuated. The processor unit 50 does not generate any control signal inputted to the gate of the first transistor Q1. Thus, the electric potential on the gate of the first transistor Q1 ($V_{gs1}$) is zero, the first transistor Q1 is switched off, and the charge electric potential $V_C$ generates a current passing through the fuse F, the resistor R1, the diode D3 and the resistor R3 connected in series. The fuse F can prevent the current from being outside a allowable safe range of the portable electronic device 200, and the capacitor C can filter alternating current caused by the charge electric potential $V_C$.

If the resistances of the resistors R1, R3 are respectively $R_1$ and $R_3$, the voltage on the gate of the second transistor Q2 ($V_{gs2}$) can be calculated according to this formula: $V_{gs2}=V_C \times R_3/(R_1+R_3)$. If $V_{gs2}$ is higher than the start-up voltage of the second transistor Q2, the second transistor Q2 can be switched on. Thus, the charge electric potential $V_C$ also generates another current passing through the fuse F, the diode D2, the LED D5, the resistor R4, the drain of the second transistor Q2 and the source of the second transistor Q2. The LED D5 is powered and emits light to show that the portable electronic device 200 is being charged.

According to the above-mentioned method, $V_{gs2}$ can be regulated by changing relative parameters (e.g., $V_C$, $R_1$, $R_3$, and the start-up voltage of the second transistor Q2), such that $V_{gs2}$ is always higher than the start-up voltage of the second transistor Q2. The parameters can be regulated into predetermined values during fabrication of the portable electronic device 200, and can also be regulated when the portable electronic device 200 is being used. For example, rheostats can be used as the resistors R1, R3, such that $V_{gs2}$ can be regulated as the portable electronic device 200 is used. Thus, the LED D5 can be always powered to emit light when the charge electric potential $V_C$ is inputted into the interface unit 10 and the electric potential of the power supply 70 is lower than the working electric potential of the portable electronic device 100.

When the power supply 70 is charged for a time such that the electric potential of the power supply 70 is higher than the working electric potential of the portable electronic device 200, the portable electronic device 200 and the processor unit 50 are actuated. The processor unit 50 detects the charge status of the power supply 70 by the conventional circuits. If the power supply 70 is not fully charged, the processor unit 50 sends two control signals (e.g., electric potentials higher than the start-up electric potentials of the transistors Q1, Q2) from the ports GPIO1, GPIO2. One control signal is sent to the gate of the first transistor Q1 by the port GPIO2 to switch on the first transistor Q1, and another control signal is sent to the gate of the second transistor Q2 by the diode D4 by the port GPIO1 to switch on the second transistor Q2. Thus, the charge electric potential $V_C$ generates a current passing through the fuse F, the resistor R1, the drain of the first transistor Q1 and the source of the first transistor Q1, and another current passing through the fuse F, the diode D2, the LED D5, the resistor R4, the drain of the second transistor Q2 and the source of the second transistor Q2. Thus, the LED D5 is still powered and emits light to show that the portable electronic device 200 is being charged. The resistors R1, R2, R3 and R4 can prevent short circuit.

If the processor unit 50 detects that the charge status of the power supply 70 is fully charged, the processor unit 50 sends a control signal (e.g., an electric potential lower than the start-up electric potentials of the second transistor Q2) from the port GPIO1. The control signal is sent to the gate of the second transistor Q2 by the diode D4 to switch off the second transistor Q2. In this way, the charge electric potential $V_C$ only generates the current passing through the fuse F, the resistor R1, the drain of the first transistor Q1 and the source of the first transistor Q1, and no current passes through the LED D5. The resistors R1, R2 can prevent short circuit. Thus, the LED D5 stops emitting light, and the users can realize that the portable electronic device 200 is fully charged.

In the present disclosure, the working electric energy of the charge indicator circuit 100 is provided by the charge electric potential $V_C$. Despite the portable electronic device 200 cannot be actuated to work by the power supply 70, the charge indicator circuit 100 can also get working electric energy from the charge power supply, such that the charge indicator circuit 100 synchronously indicates the charge status of the portable electronic device 200 in the whole charge process. Furthermore, the power supply 70 is connected to the LED D5 by the diode D1, and can also be used to electrify the LED D5 to emit light and show the charge status of the portable electronic device 200 according to conventional methods. The charge indicator circuit 100 can also be used in other electronic devices.

It is to be further understood that even though numerous characteristics and advantages of the present embodiments have been set forth in the foregoing description, together with details of structures and functions of various embodiments, the disclosure is illustrative only, and changes may be made in detail, especially in matters of shape, size, and arrangement of parts within the principles of the present invention to the full extent indicated by the broad general meaning of the terms in which the appended claims are expressed.

What is claimed is:

1. A charge indicator circuit for indicating an electronic device charged by an inputted charge electric potential, comprising:
   an interface unit;
   a switch unit connected to the interface unit;
   a processor unit connected to the switch unit; and
   an indicator unit connected to the switch unit; wherein the charge electric potential is inputted into the charge indicator circuit from the interface unit and powers the indicator unit to emit light when the processor unit is switched off, and the processor unit detects the charge status of the electronic device and controls the switch unit according to the detect results when the processor unit is switched on, such that the switch unit allows the indicator unit to be powered to emit light by the charge electric potential before the electronic device is fully charged, and prevents the indicator unit from being powered to emit light by the charge electric potential after the electronic device is fully charged.

2. The charge indicator circuit as claimed in claim 1, wherein the switch unit includes a first transistor and a second transistor both connected to the processor unit, and the processor unit controls the two transistors to be switched on and switched off.

3. The charge indicator circuit as claimed in claim 2, wherein the two transistors are both Complementary Metal Oxide Semiconductor (CMOS) transistors, the sources of the two transistors are both grounded, and the gates of the two transistors are both connected to the processor unit to be controlled by control signals sent by the processor unit.

4. The charge indicator circuit as claimed in claim 3, wherein the interface unit is connected to the drain of the first transistor by a resistor, and is also connected to the gate of the second transistor by the resistor.

5. The charge indicator circuit as claimed in claim 4, wherein the indicator unit is a light emitting diode (LED), the interface unit is connected to the indicator unit, and the indicator unit is connected to the drain of the second transistor by another resistor.

6. The charge indicator circuit as claimed in claim 4, further comprising a filter unit connected between the interface unit and the resistor.

7. The charge indicator circuit as claimed in claim 4, wherein the processor unit is synchronously switched on and switched off with the electronic device.

8. An electronic device, comprising:
   a housing;
   a chargeable power supply received in the housing;
   a charge interface mounted on the housing and connected to the power supply for inputting a charge electric potential into the electronic device to charge the power supply; and
   a charge indicator circuit including an interface unit mounted on the housing, a switch unit connected to the interface unit, a processor unit connected to the switch unit and connected to the power supply, and an indicator unit connected to the switch unit and the processor unit and mounted on the housing; wherein the charge electric potential powers the indicator unit to emit light when the processor unit is switched off, and the processor unit detects the charge status of the power supply and controls the switch unit according to the detect results when the processor unit is switched on, such that the switch unit allows the indicator unit to be powered to emit light by the charge electric potential before the power supply is fully charged, and prevents the indicator unit from being powered to emit light by the charge electric potential after the power supply is fully charged.

9. The electronic device as claimed in claim 8, wherein the switch unit includes a first transistor and a second transistor both connected to the processor unit, the processor unit controls the two transistors to be switched on and switched off.

10. The electronic device as claimed in claim 9, wherein the two transistors are both Complementary Metal Oxide Semiconductor (CMOS) transistors, the sources of the two transistors are both grounded, and the gates of the two transistors are both connected to the processor unit to be controlled by control signals sent by the processor unit.

11. The electronic device as claimed in claim 10, wherein the interface unit is connected to the drain of the first transistor by a resistor, and is also connected to the gate of the second transistor by the resistor.

12. The electronic device as claimed in claim 11, wherein the indicator unit is a light emitting diode (LED), the interface unit is connected to the indicator unit, and the indicator unit is connected to the drain of the second transistor by another resistor.

13. The electronic device as claimed in claim 11, further comprising a filter unit connected between the interface unit and the resistor.

14. The electronic device as claimed in claim 11, wherein the processor unit is synchronously switched on and switched off with the electronic device.

15. The electronic device as claimed in claim 8, wherein the interface unit is an input connector integrated with the charge interface.

* * * * *